(12) United States Patent
Maeda et al.

(10) Patent No.: US 8,623,745 B2
(45) Date of Patent: Jan. 7, 2014

(54) COMPOSITION FOR FORMING GATE INSULATING FILM FOR THIN-FILM TRANSISTOR

(75) Inventors: Shinichi Maeda, Funabashi (JP); Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 221 days.

(21) Appl. No.: 13/132,526

(22) PCT Filed: Nov. 26, 2009

(86) PCT No.: PCT/JP2009/069949
§ 371 (c)(1),
(2), (4) Date: Jun. 2, 2011

(87) PCT Pub. No.: WO2010/061886
PCT Pub. Date: Jun. 3, 2010

(65) Prior Publication Data
US 2011/0318907 A1    Dec. 29, 2011

(30) Foreign Application Priority Data
Nov. 28, 2008    (JP) ................. 2008-304764

(51) Int. Cl.
*H01L 21/20*    (2006.01)

(52) U.S. Cl.
USPC ....... 438/479; 438/781; 257/E21.09; 525/124

(58) Field of Classification Search
USPC .............. 438/479, 781; 257/E21.09; 525/124
See application file for complete search history.

(56) References Cited

U.S. PATENT DOCUMENTS

| 6,306,555 | B1 | 10/2001 | Schulz et al. |
| 7,482,625 | B2 * | 1/2009 | Kim et al. ............ 257/40 |
| 2001/0036591 | A1 | 11/2001 | Schulz et al. |
| 2006/0214159 | A1 | 9/2006 | Nakayama |
| 2006/0290429 | A1 | 12/2006 | Kishioka et al. |
| 2008/0206680 | A1 | 8/2008 | Kishioka et al. |

FOREIGN PATENT DOCUMENTS

| JP | A-2001-181221 | 7/2001 |
| JP | A-2003-258260 | 9/2003 |
| JP | A-2004-72049 | 3/2004 |
| JP | A-2006-303465 | 11/2006 |
| JP | A-2007-27524 | 2/2007 |
| WO | WO 2004/034148 A1 | 4/2004 |

OTHER PUBLICATIONS

Halik et al., "High-mobility organic thin-film transistors based on α, α¹-didecyloligothiophenes," Journal of Applied Physics, Mar. 2003, pp. 2977-2981, vol. 93—No. 5.
Kato et al., "High mobility of pentacene field-effect transistors with polyimide gate dielectric layers," Applied Physics Letters, May 10, 2004, pp. 3789-3791, vol. 84—No. 19.
International Search Report mailed Mar. 2, 2010 issued in International Patent Application No. PCT/JP2009/069949 (with translation).

* cited by examiner

*Primary Examiner* — Alexander Ghyka
*Assistant Examiner* — Stanetta Isaac
(74) *Attorney, Agent, or Firm* — Oliff & Berridge, PLC

(57) ABSTRACT

There is provided a novel composition for forming a gate insulating film taking into consideration also electrical characteristics after other processes such as wiring by irradiation with an ultraviolet ray and the like during the production of an organic transistor using a gate insulating film. A composition for forming a gate insulating film for a thin-film transistor comprising: a component (i): an oligomer compound or a polymer compound containing a repeating unit having a structure in which a nitrogen atom of a triazine-trione ring is bonded to a nitrogen atom of another triazine-trione ring through a hydroxyalkylene group; and a component (ii): a compound having two or more blocked isocyanate groups in one molecule thereof.

8 Claims, 2 Drawing Sheets

COMPOSITION FOR FORMING GATE INSULATING FILM FOR THIN-FILM TRANSISTOR

TECHNICAL FIELD

The present invention relates to a composition for forming a gate insulating film for a thin-film transistor, and further to an organic transistor produced using the composition for forming a gate insulating film for a thin-film transistor.

BACKGROUND ART

At present, there is developed, as a flexible device such as electronic paper, an electronic device using a plastic substrate such as a polycarbonate and a polyethylene terephthalate. From the problem that these plastic substrates are slightly elongated/contracted during heat application, an enhancement of heat resistance (low thermal expansion characteristics) thereof has become an urgent necessity.

Thus, in order to relieve a thermal stress itself applied on a plastic substrate, a production process of an electronic device that is performed at lower temperatures is also developed. One of processes for which a high temperature is mostly required in the production of electronic devices is a process of forming/curing a gate insulating film of an organic transistor, and it is required that the production process of a gate insulating film is performed at lower temperatures.

Here, as the method for forming a gate insulating film at lower temperatures, there are disclosed a method of anodizing the surface of an electrode (see Patent Document 1), a method by a chemical vapor deposition method (see Patent Document 2), and the like. However, a production process of these methods is cumbersome.

Therefore, a material capable of being easily formed into a film by application by a spin coating method, a printing method, and other applying methods, is desired. As an example of production of a gate insulating film by application, there is a method including applying a solution containing poly-4-vinylphenol and poly(melamine-formaldehyde) by spin-coating and then curing the solution at 200° C. (see Non-patent Document 1). However, in this method, the treating temperature is as high as 200° C., and at this temperature, the effects of a thermal expansion of a plastic substrate remarkably materialize, so that it is difficult to apply this method to the production of electronic paper or the like for which a fine pixel is required.

On the other hand, a soluble polyimide is known as one of insulating materials which can be produced at a relatively low temperature and for which high insulation properties can be expected. A polyimide has generally a high thermal decomposition temperature and high electric resistance, so that the polyimide is widely used as an insulating material for an electronic device. For example, there is disclosed a method using a polyimide cured at 180° C. as a gate insulating film for a high-precision organic transistor (see Non-patent Document 2).

In recent years, particularly in a thin-film transistor excellent in mechanical flexibility represented by an organic transistor, for the purpose of reducing the production cost, the formation of an electrode or a wiring by irradiation with an ultraviolet ray having high energy is performed.

RELATED-ART DOCUMENT

Patent Document

Patent Document 1: Japanese Patent Application Publication No. JP-A-2003-258260
Patent Document 2: Japanese Patent Application Publication No. JP-A-2004-72049

Non-Patent Document

Non-patent Document 1: Journal of Applied Physics (J. Appl. Phys.), Vol. 93, No. 5, 1 Mar. 2003, p. 2977-2981
Non-patent Document 2: Applied Physics Letters (Appl. Phys. Lett.), Vol. 84, No. 19, May 2004, p. 3789-3791

DISCLOSURE OF THE INVENTION

Problem to be Solved by the Invention

As described above, in order to obtain a highly reliable organic transistor, quality required for an insulating film material is extremely high, that is, capable of being produced by a simple process, for example, at a relatively low temperature such as 180° C. or less, and having high solvent resistance, high light resistance, and high insulation properties.

However, even though in a production process of an organic transistor, it is important to perform an insulating film producing process at lower temperatures, it cannot be mentioned that there are many options of the insulating film material capable of being produced by application and by a process at 180° C. or less and having advantageous electrical characteristics. Moreover, even a soluble polyimide that has been regarded as capable of satisfying all of these conditions has problems of having a low solubility in a solvent for the application and of having low light resistance.

Thus, it is an object of the present invention to provide a novel composition for forming a gate insulating film taking into consideration also electrical characteristics after other processes such as wiring by irradiation with an ultraviolet ray and the like during the production of an organic transistor using a gate insulating film, particularly from the viewpoint of practicality.

Means for Solving the Problem

As a result of assiduous research intended to overcome these disadvantages, the inventors of the present invention have found that a gate insulating film can easily be formed by forming a cured film from a composition containing a compound having two or more blocked isocyanate groups in one molecule thereof and a compound containing a specified repeating unit having a triazine-trione ring, and the formed gate insulating film has satisfactory insulation properties and characteristics excellent in solvent resistance and light resistance that have been unsatisfactory with respect to a conventional insulating film material.

Specifically, the present invention relates to, according to a first aspect, a composition for forming a gate insulating film for a thin-film transistor containing a component (i): an oligomer compound or a polymer compound containing a repeating unit having a structure in which a nitrogen atom of a triazine-trione ring is bonded to a nitrogen atom of another triazine-trione ring through a hydroxyalkylene group, and a component (ii): a compound having two or more blocked isocyanate groups in one molecule thereof.

According to a second aspect, in the composition for forming a gate insulating film for a thin-film transistor according to the first aspect, the component (i) is a compound containing a repeating unit of Formula (1):

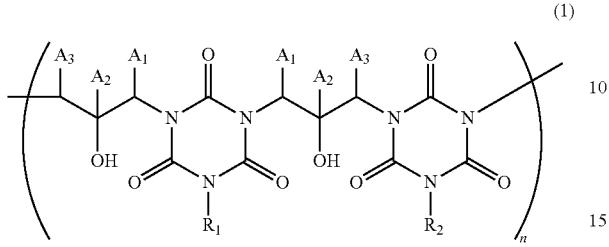

(1)

(where $R_1$ and $R_2$ are independently a $C_{1-6}$ alkyl group, a $C_{3-6}$ alkenyl group, a monovalent organic group containing a $C_{6-10}$ aromatic ring, a trifluoromethyl group, or a pentafluoroethyl group; $A_1$, $A_2$, and $A_3$ are independently a hydrogen atom, a methyl group, or an ethyl group; and n is an integer of 2 to 500).

According to a third aspect, in the composition for forming a gate insulating film for a thin-film transistor according to the first aspect or the second aspect, the component (ii) is at least one compound among compounds of Formula (2) to Formula (4):

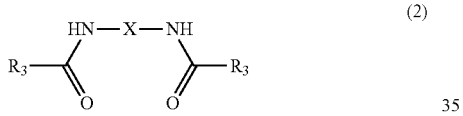

(2)

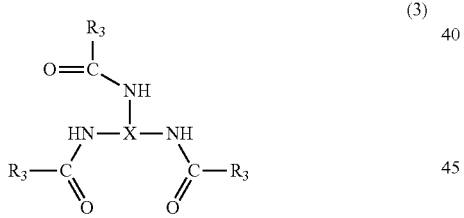

(3)

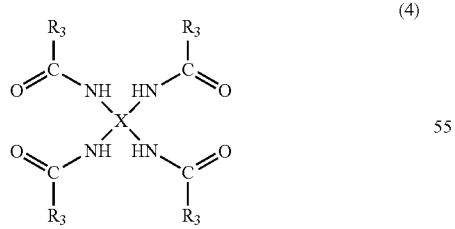

(4)

(where X is a divalent to tetravalent organic group; and $R_3$ is a monovalent organic group of a blocking portion).

According to a fourth aspect, in the composition for forming a gate insulating film for a thin-film transistor according to the first aspect to the third aspect, the component (ii) is at least one compound among compounds of Formula (5) to Formula (7):

(5)

(6)

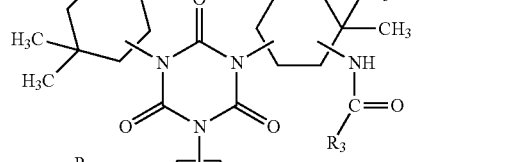

(7)

(where Y is a $C_{1-10}$ alkylene group; and $R_3$ is a monovalent organic group of a blocking portion).

According to a fifth aspect, in the composition for forming a gate insulating film for a thin-film transistor according to the first aspect to the fourth aspect, the component (ii) is a compound of Formula (10):

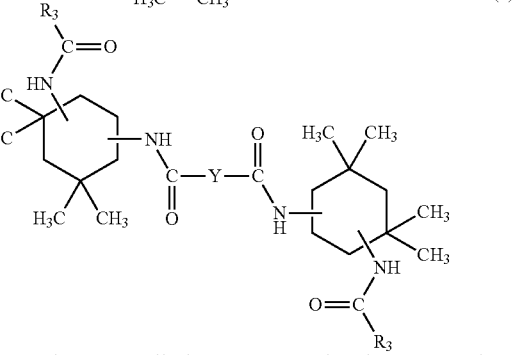

(10)

According to a sixth aspect, in the composition for forming a gate insulating film for a thin-film transistor according to any one of the first aspect to the fifth aspect, the component (i) is a reaction product of a compound of Formula (8) and a compound of Formula (9):

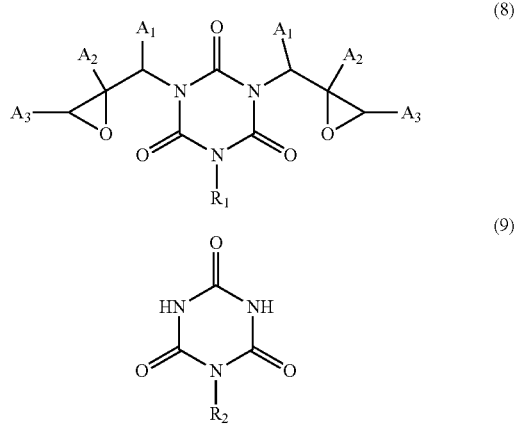

(where $R_1$, $R_2$, $A_1$, $A_2$, and $A_3$ are individually the same as those defined in Formula (1)).

According to a seventh aspect, in the composition for forming a gate insulating film for a thin-film transistor according to any one of the first aspect to the sixth aspect, the component (ii) is contained at 10 to 100 parts by mass relative to 100 parts by mass of the component (i).

According to an eighth aspect, a gate insulating film is formed by using the composition for forming a gate insulating film for a thin-film transistor as described in any one of the first aspect to the seventh aspect.

According to a ninth aspect, a thin-film transistor includes the gate insulating film as described in the eighth aspect.

According to a tenth aspect, a production method of a gate insulating film for a thin-film transistor includes a process of applying the composition for forming a gate insulating film for a thin-film transistor as described in any one of the first aspect to the seventh aspect onto a substrate and baking the composition at a temperature of 180° C. or less.

According to an eleventh aspect, a production method of a thin-film transistor, includes:

a process of applying the composition for forming a gate insulating film for a thin-film transistor as described in any one of the first aspect to the seventh aspect onto a substrate and baking the composition at a temperature of 180° C. or less to obtain a gate insulating film for a thin-film transistor; and a process of forming a semiconductor layer of a thin-film transistor on the gate insulating film by applying an organic semiconductor.

Effects of the Invention

The composition for forming a gate insulating film for a thin-film transistor of the present invention is easily soluble in various solvents, that is, has high solvent solubility, and can easily adjust the solid content concentration, so that the composition can easily form a gate insulating film having an advantageous film thickness.

The gate insulating film of the present invention formed from the above composition for forming a gate insulating film for a thin-film transistor is insoluble in an organic solvent, satisfies the standard of insulation properties required for the gate insulating film, and causes a small amount of current leaking at a gate.

Particularly, the gate insulating film of the present invention has characteristics of causing an extremely small amount of degradation of insulation by irradiation with an ultraviolet ray and of being excellent in light resistance and is excellent in transparency.

In the gate insulating film of the present invention, a compound constituting the film contains a triazine-trione ring, so that the gate insulating film has dielectric breakdown voltage resistance higher than that of a conventional insulating film composed mainly of an acrylic skeleton and has high reliability as a gate insulating film for an organic transistor to which a high electric field is necessary to be applied.

Further, the organic transistor having the gate insulating film of the present invention can be produced as an organic transistor having a small amount of leaking current between source and drain, a large on/off ratio, a high electric field effect mobility, and a small shift of threshold voltage. The organic transistor can maintain these electrical characteristics over a long period.

BEST MODES FOR CARRYING OUT THE INVENTION

Figure 1:
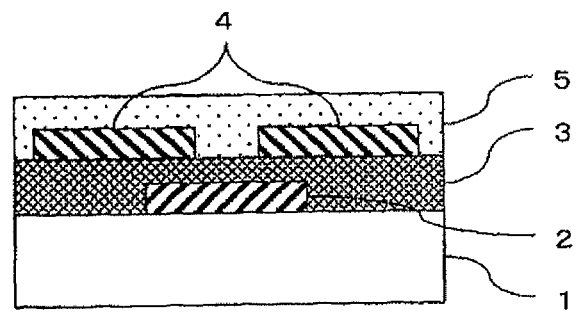
FIG. 1 is a schematic cross-sectional view showing a structure of a thin-film transistor of a first example having the gate insulating film of the present invention.

Hereinafter, the present invention is described more in detail.

The composition for forming a gate insulating film for a thin-film transistor of the present invention contains as the component (i), an oligomer compound or a polymer compound containing a repeating unit having a structure in which a nitrogen atom of a triazine-trione ring is bonded to a nitrogen atom of another triazine-trione ring through a hydroxyalkylene group, and as the component (ii), a compound having two or more blocked isocyanate groups in one molecule thereof.

[Component (i)]

The component (i) used in the present invention is an oligomer compound or a polymer compound containing a repeating unit having a structure in which a nitrogen atom of a triazine-trione ring is bonded to a nitrogen atom of another triazine-trione ring through a hydroxyalkylene group, and is preferably a compound containing a repeating unit of Formula (1):

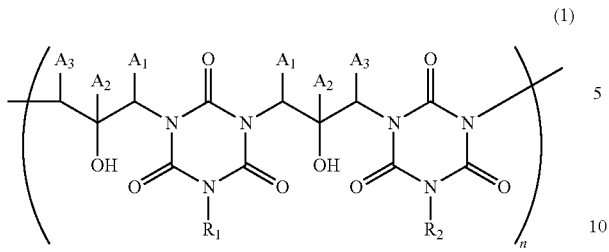

(1)

In Formula (1), $R_1$ and $R_2$ are independently a $C_{1-6}$ alkyl group, a $C_{3-6}$ alkenyl group, a monovalent organic group containing a $C_{6-10}$ aromatic ring, a trifluoromethyl group, or a pentafluoroethyl group.

$A_1$, $A_2$, and $A_3$ are independently a hydrogen atom, a methyl group, or an ethyl group.

n is an integer of 2 to 500.

Examples of the $C_{1-6}$ alkyl group include a methyl group, an ethyl group, an n-pentyl group, an isopropyl group, and a cyclohexyl group.

Examples of the $C_{3-6}$ alkenyl group include an ally group, a 2-butenyl group, a 3-butenyl group, and a 2-pentenyl group.

Examples of the monovalent organic group containing a $C_{6-10}$ aromatic ring include a phenyl group, a benzyl group, and a naphthyl group.

For the oligomer compound or the polymer compound used in the present invention, it is required to have high transparency in an ultraviolet region. This is because the gate insulating film for an organic transistor is necessary to be excellent in light resistance for the purpose of preventing the degradation of insulation properties due to irradiation with an ultraviolet ray. Here, the light resistance means that the insulation properties of the gate insulating film are not degraded even when the gate insulating film is irradiated with an ultraviolet ray having a wavelength of 254 nm in a high energy amount (several $J/cm^2$) that is necessary for changing hydrophilicity/hydrophobicity of the gate insulating film. Accordingly, it is considered that when the gate insulating film is transparent regarding a wavelength of around 254 nm, the gate insulating film does not absorb energy, so that the degradation of the insulation properties thereof is difficult to be caused.

As described above, it is preferred that also in a repeating unit of Formula (1), the substituents of $R_1$ and $R_2$ are substituents having high transparency in an ultraviolet region. Optimal examples of such a substituent include an alkyl group, an alkenyl group, a fluoroalkyl group, and an alicyclic group such as a cyclohexyl group. An aromatic group such as a phenyl group, a benzyl group, and a naphthyl group can also be used so long as the transparency is not impaired.

The optimal molecular weight of the oligomer compound or the polymer compound used in the present invention is not particularly limited. However, when the molecular weight is too small, the solvent solubility of the compound becomes too high, so that there is a fear that the compound cannot endure a production process of a transistor. On the other hand, when the molecular weight is too large, the solvent solubility becomes too low, so that there is a fear that a composition for forming a gate insulating film for a thin-film transistor with a high solid content concentration cannot be obtained. Therefore, a preferred molecular weight is, for example, 1,000 to 200,000, preferably 5,000 to 50,000, as the weight average molecular weight (in terms of polystyrene).

Although the method for obtaining the oligomer compound or the polymer compound used in the present invention is not particularly limited, by subjecting, for example, a compound of Formula (8) below and a compound of Formula (9) below to a condensation-polymerization reaction in an appropriate organic solvent, the compounds can be obtained.

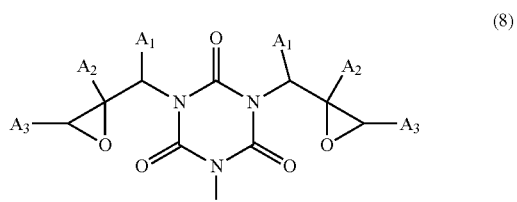

(8)

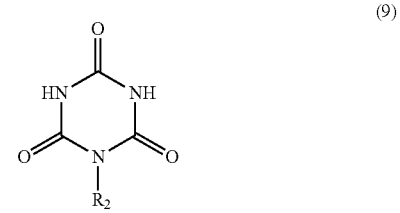

(9)

In the Formulae, $R_1$, $R_2$, $A_1$, $A_2$, and $A_3$ are individually the same as those defined in Formula (1).

Preferred examples of the compound of Formula (8) include compounds of Formula (A-1) to Formula (A-9):

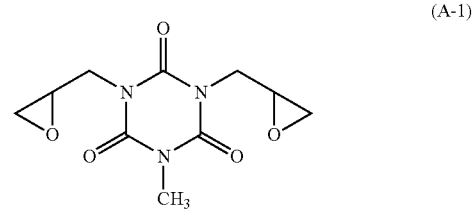

(A-1)

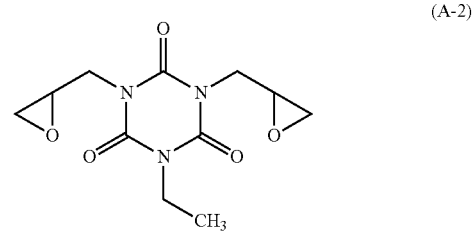

(A-2)

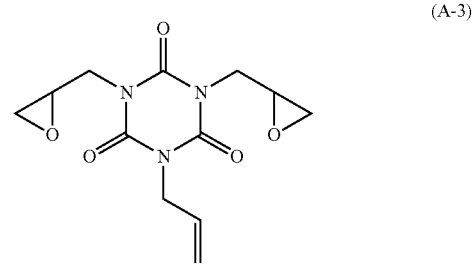

(A-3)

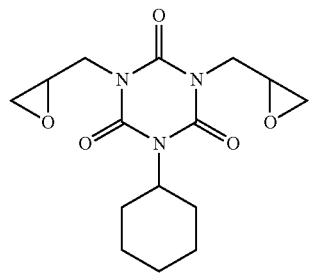
(A-4)
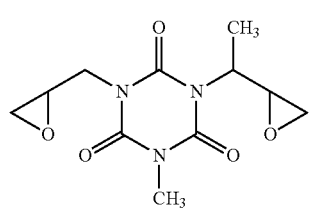
(A-5)
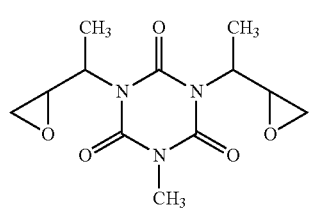
(A-6)
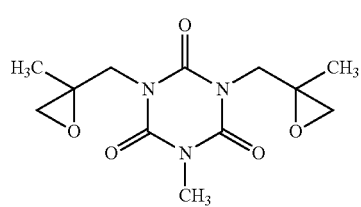
(A-7)
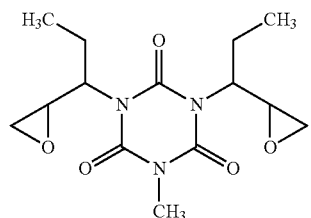
(A-8)
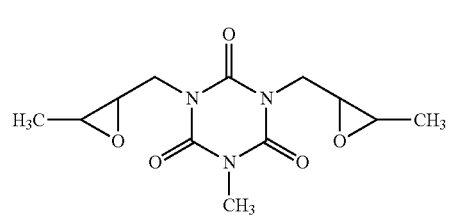
(A-9)
As the compound of Formula (8), so long as the electrical characteristics of the thin-film transistor are not impaired, besides the compounds of Formula (A-1) to Formula (A-9), there may also be used compounds of Formula (A-10) to Formula (A-12):
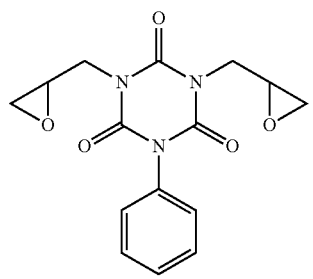
(A-10)
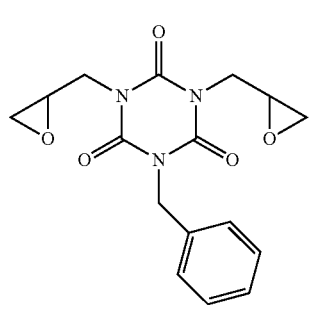
(A-11)
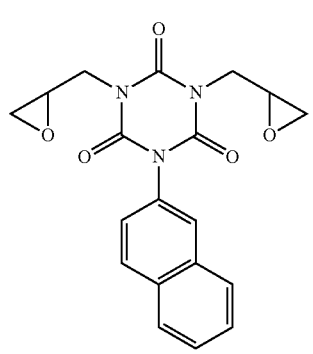
(A-12)
Preferred specific examples of the compound of Formula (9) include compounds of Formula (B-1) to Formula (B-4):
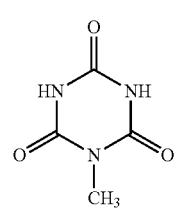
(B-1)
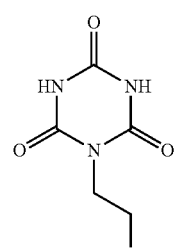
(B-2)

-continued (B-3)
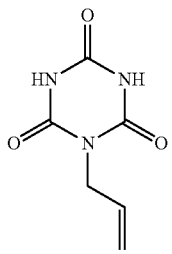

(B-4)
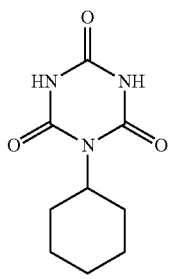

As the compound of Formula (9), so long as the electrical characteristics of the thin-film transistor are not impaired, besides the compounds of Formula (B-1) to Formula (B-4), there may also be used compounds of Formula (B-5) to Formula (B-7):

(B-5)
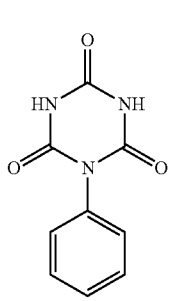

(B-6)
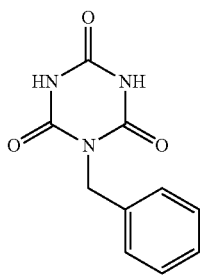

(B-7)
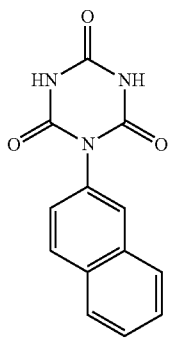

By selecting as the compound of Formula (8), only the compounds of Formula (A-1) to Formula (A-9) and as the compound of Formula (9), only the compounds of Formula (B-1) to Formula (B-4), and by subjecting these selected compounds to a condensation-polymerization reaction, there can be obtained an oligomer compound or a polymer compound having particularly high insulation properties and further having high transparency in an ultraviolet light region. Then, such an oligomer compound or a polymer compound becomes the most suitable compound when the compound is used for the composition for forming a gate insulating film for a thin-film transistor of the present invention.

Examples of the method for mixing the compounds of Formula (8) and Formula (9) in an organic solvent and subjecting the compounds to a condensation-polymerization reaction include: a method including heating and stirring a solution in which the compound of Formula (8) and the compound of Formula (9) are dispersed or dissolved in an organic solvent and adding an appropriate catalyst to the resulting reaction mixture by dissolving the catalyst in the organic solvent to effect the reaction; and a method including heating and stirring a solution in which the compound of Formula (8), the compound of Formula (9), and an appropriate catalyst are dispersed or dissolved in an organic solvent to effect the reaction.

When a plurality of types of the compound of Formula (8) and the compound of Formula (9) exist, the plurality of types of compounds in a state in which the compounds are mixed beforehand may be subjected to a condensation-polymerization reaction, or these compounds may individually be subjected to a condensation-polymerization reaction sequentially.

In the condensation-polymerization reaction, the blending ratio of the compound of Formula (8) and the compound of Formula (9), that is, the number of moles of the compound of Formula (8): the number of moles of the compound of Formula (9) is desirably 1:0.5 to 1:1.5.

Like an ordinary condensation-polymerization reaction, as the molar ratio becomes closer to 1:1, the polymerization degree and the molecular weight of the generated compound increase.

Examples of the organic solvent used in the above condensation-polymerization reaction include ethyl lactate, butyl lactate, propyleneglycol monomethyl ether, propyleneglycol monomethyl ether acetate, N,N-dimethylformamide, N,N-dimethylformacetamide, N-methyl-2-pyrrolidone, N-methylcaprolactam, dimethylsulfoxide, tetramethylurea, pyridine, dimethylsulfone, hexamethylsulfoxide, γ-butyrolactone, ethyleneglycol monomethyl ether, ethyleneglycol monoethyl ether, methyl cellosolve acetate, ethyl cellosolve acetate, diethyleneglycol monomethyl ether, diethyleneglycol monoethyl ether, propyleneglycol, propyleneglycol propyl ether acetate, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate.

In the above condensation-polymerization reaction, a quaternary ammonium salt such as benzyltriethylammonium chloride, tetrabutylammonium chloride, and tetraethylammonium bromide, or a phosphonium salt such as triphenylphosphine, ethyltriphenylphosphonium bromide, and tetrabutylphosphonium bromide can suitably be used as a reaction catalyst.

The reaction temperature and the reaction time for the above condensation-polymerization reaction depend on the used compound, concentration, and the like, and for example, the reaction time and the reaction temperature are accordingly selected from a range of 0.1 to 100 hours and a range of 20 to 200° C.

When the above reaction catalyst of the quaternary ammonium salt, the phosphonium salt, or the like is used, the reaction catalyst is preferably used in a range of 0.001 to 50% by mass, based on the total mass of the compounds to be reacted (that is, the compounds of Formula (8) and Formula (9)).

Although the thus obtained reaction solution may be used as it is for the composition for forming a gate insulating film for a thin-film transistor, the reaction solution contains a reaction catalyst, an unreacted monomer, and the like, so that it is preferred that the reaction product is recovered, washed, and then used for the composition for forming a gate insulating film.

As the recovery of the reaction product, a method including charging the reaction solution into a stirred poor solvent to precipitate the reaction product and filtering the precipitated reaction product, is simple. The poor solvent used at this time is not particularly limited and examples of the poor solvent include methanol, hexane, heptane, ethanol, toluene, water, and ether. It is preferred that after the precipitate is filtered and recovered, the reaction product is washed with the above poor solvent. The recovered reaction product can be dried under normal pressure or reduced pressure at normal temperature or by heating so that the recovered reaction product is brought into a powder state.

By repeating twice to ten times such an operation that the above reaction product in the powder state is further dissolved in a good solvent, followed by reprecipitation in a poor solvent, impurities in the reaction product can also be further reduced. At this time, by using as the poor solvent, three or more types of poor solvents such as alcohols, ketones, and hydrocarbons, the purification efficiency can be further enhanced.

[Component (ii)]

The component (ii) used in the present invention is a compound having two or more blocked isocyanate groups in one molecule thereof. By using the component (ii), the composition for forming a gate insulating film for an organic transistor of the present invention can effectively prevent intermixing between a semiconductor material overcoated, an electrode material, a second layer of gate insulating film, and an electrode forming underlayer film.

Here, the electrode forming underlayer film is a film for forming an electrode by subjecting the surface of the insulating film composed of an organic polymer to pre-treatment such as irradiation with an ultraviolet ray to pattern two different regions of which one region has hydrophilicity and another region has hydrophobicity beforehand.

When a blocked isocyanate group contained in the component (ii) is heated, a protecting group (blocking portion) of the blocked isocyanate group is thermally dissociated to be eliminated, and through the resulting isocyanate group, the component (ii) is thermally crosslinked with an oligomer compound or a polymer compound containing a repeating unit having a triazine-trione ring having a hydroxyalkylene group as a substituent on a nitrogen atom.

As the compound having two or more blocked isocyanate groups in one molecule thereof, there can be mentioned at least one compound among the compounds of Formula (2) to Formula (4):

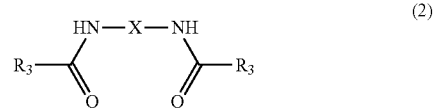

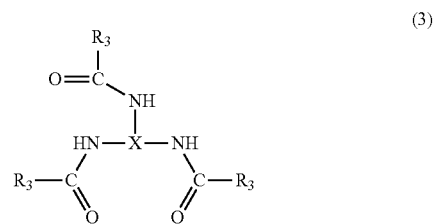

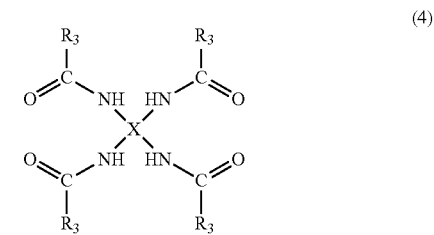

In the Formulae, X is a divalent to tetravalent organic group and $R_3$ is a monovalent organic group of a blocking portion.

An isocyanate group (—NCO) in the above Formulae is blocked by a protecting group of $R_3$.

Specific examples of $R_3$ in the above Formulae include monovalent organic groups of Formula (C-1) to Formula (C-8):

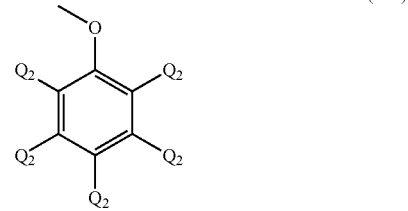

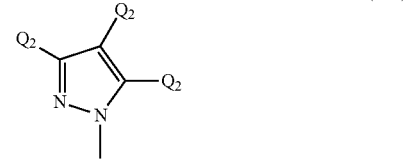

-continued

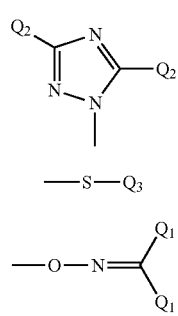
(C-6)

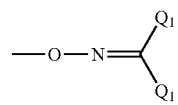
(C-7)

—S—Q₃
(C-8)

In the Formulae, $Q_1$s are independently a $C_{1-6}$ monovalent organic group such as a methyl group, an ethyl group, a propyl group, a butyl group, a hexyl group, a methoxymethyl group, and an ethoxyethyl group.

$Q_2$s are independently a hydrogen atom, a halogen atom, or a $C_{3\ or\ less}$ monovalent substituent such as a methyl group, an ethyl group, and a propyl group.

$Q_3$ is a $C_{8-18}$ alkyl group that may be branched.

$R_3$ is a protecting group (blocking portion), so that $R_3$ is necessary to be thermally dissociated by heating during the thin-film formation to be eliminated. The temperature for heating the gate insulating film for an organic transistor is desired to be 180° C. or less from the viewpoint of heat resistance of a plastic substrate, and the temperature for the thermal dissociation of the protecting group is preferably also 180° C. or less. When the temperature for the thermal dissociation is too low, however, the crosslinking may progress in a solution state, which is not preferred. A temperature range for the thermal dissociation is preferably 100 to 180° C., more preferably 100 to 150° C.

More specific examples of the protecting group ($R_3$) include groups of Formula (D-1) to Formula (D-15). Particularly preferred protecting groups are Formulae (D-7), (D-11), and (D-14).

(D-1)
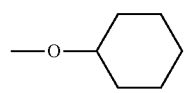

(D-2)
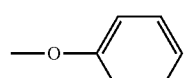

(D-3)
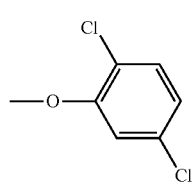

(D-4)
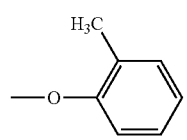

(D-5)
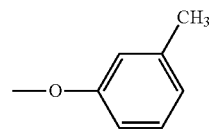

(D-6)
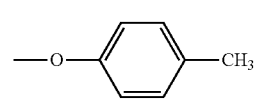

(D-7)
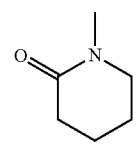

(D-8)
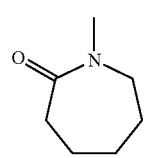

(D-9)
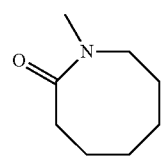

(D-10)
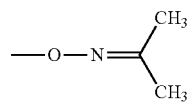

(D-11)
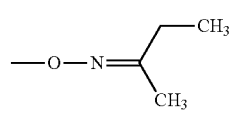

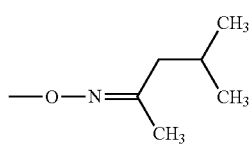
(D-12)

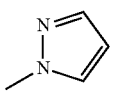
(D-13)

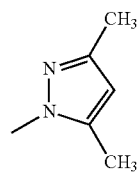
(D-14)

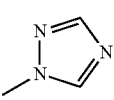
(D-15)

As described above, the gate insulating film for an organic transistor is necessary to be excellent in light resistance for the purpose of preventing the degradation of insulation properties due to irradiation with an ultraviolet ray and when the gate insulating film is transparent relative to a wavelength of around 254 nm, the gate insulating film does not absorb energy, so that the degradation of insulation properties is difficult to be caused.

From such a viewpoint, particularly preferred specific examples of the component (ii) include compounds selected from the compounds of Formula (5) to Formula (7) below derived from isophorone diisocyanate and the compounds of Formula (11) and Formula (12) below derived from hexamethylene diisocyanate.

The compound of Formula (7) is preferred from the viewpoint of insulation properties and light resistance.

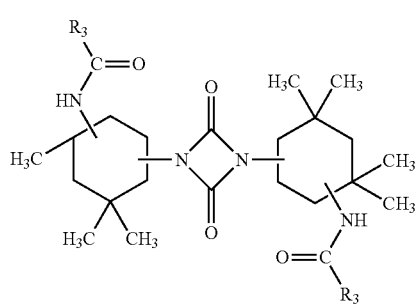
(5)

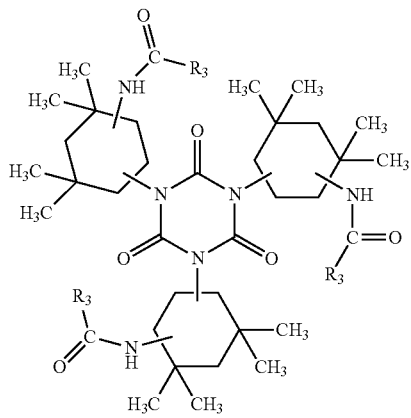
(6)

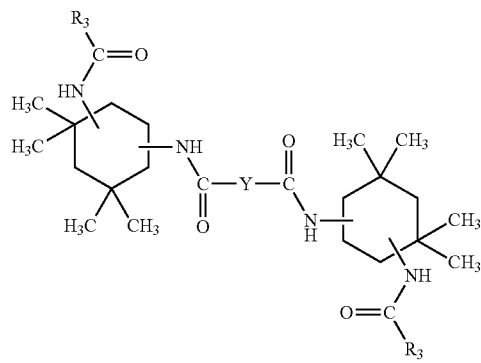
(7)

In the Formulae, Y is a $C_{1-10}$ alkylene group and $R_3$ is a monovalent organic group of a blocking portion as defined in Formula (2) to Formula (4).

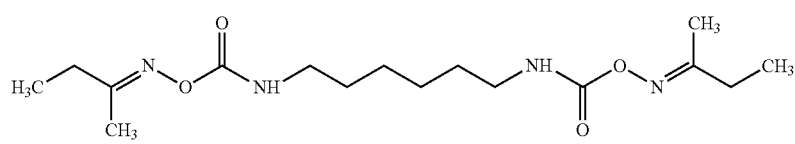
(11)

-continued

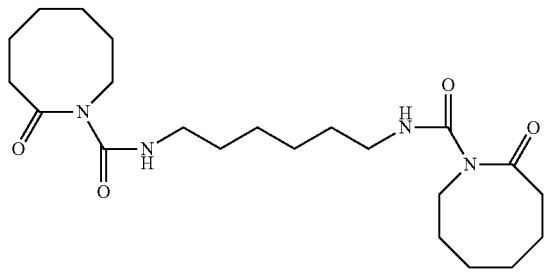

(12)

Particularly, a compound of Formula (10) below is the most preferred from the viewpoint of thermal dissociation temperature, insulation properties, and light resistance.

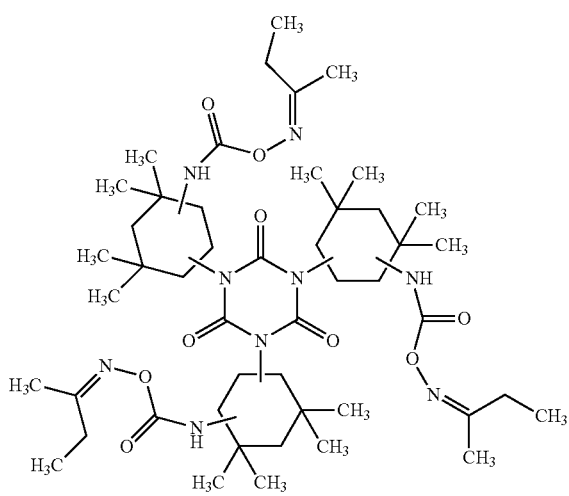

(10)

Although an additive amount of the component (ii), that is, a compound having two or more blocked isocyanate groups in one molecule thereof, varies depending on the type of solvent used for a composition for forming a gate insulating film for an organic transistor and the required solution viscosity, the additive amount is 10 to 100 parts by mass, relative to 100 parts by mass of the oligomer compound or the polymer compound that is the component (i). When unreacted components exist in a large amount, the impairment of insulation properties and solvent resistance may occur, so that the additive amount of the component (ii) is preferably 10 to 55 parts by mass. In addition, when the amount of a crosslinker is too small, the impairment of solvent resistance may occur, so that the additive amount of the component (ii) is more preferably 30 to 55 parts by mass.

[Solvent]

The composition for forming a gate insulating film for a thin-film transistor of the present invention contains the component (i), the component (ii), and further, if desired, other additives described below. The composition is actually used frequently as a coating liquid in which the composition is dissolved in a solvent. Here, the "composition" in the present invention includes also a state of a coating liquid in which the composition is dissolved in a solvent.

At this time, the solid content is, for example 0.5 to 30% by mass, or for example 5 to 30% by mass. The "solid content" as called here means a mass remaining after subtracting the mass of a solvent from the mass of the composition for forming a gate insulating film for a thin-film transistor.

Examples of the solvent used for the preparation of the coating liquid include ethyleneglycol monomethyl ether, ethyleneglycol monoethyl ether, ethyleneglycol monobutyl ether, methyl cellosolve acetate, ethyl cellosolve acetate, diethyleneglycol monomethyl ether, diethyleneglycol monoethyl ether, propyleneglycol, propyleneglycol monomethyl ether, propyleneglycol monomethyl ether acetate, propyleneglycol propyl ether acetate, propyleneglycol monobutyl ether, propyleneglycol monobutyl ether acetate, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, methyl lactate ester, ethyl lactate ester, n-propyl lactate ester, n-butyl lactate ester, isoamyl lactate ester, N,N-dimethylformamide, N,N-dimethylformacetamide, N-methyl-2-pyrrolidone, N-methylcaprolactam, dimethylsulfoxide, tetramethylurea, pyridine, dimethylsulfone, hexamethylsulfoxide, and γ-butyrolactone.

The solvent may accordingly be selected from the above solvents according to the molecular weight of the oligomer compound or the polymer compound contained in the composition for forming a gate insulating film for a thin-film transistor of the present invention to be used. For the purpose of, for example, adjusting the surface tension of the composition or adjusting the wettability to the substrate, a plurality of solvents can be mixed to be used.

Here, as described above, it may also be performed that the compound of Formula (8) and the compound of Formula (9) are subjected to the polymerization reaction, and then in the resulting reaction solution as it is, the component (ii) is blended to prepare the composition for forming a gate insulating film for a thin-film transistor. In this case, as the solvent for diluting, a solvent that is the same as or different from the solvent used for the polymerization reaction may be added.

[Other Additives]

<Surfactant>

In the composition for forming a gate insulating film for a thin-film transistor of the present invention, for suppressing the formation of a pinhole, a striation, and the like and for further enhancing the applicability relative to a surface unevenness, a surfactant may be blended.

Examples of the surfactant include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene•polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (manufactured by Mitsubishi Materials Electronic Chemicals Co., Ltd. (former: Jemco Inc.)), MEGAFAC F171 and F173 (manufactured by DIC Corporation (former: Dainippon Ink & Chemicals, Inc.)), Fluorad FC430 and FC431 (manufactured by Sumitomo 3M Limited), AsahiGuard AG710 and Surflon S-382, SC101, SC102, SC103, SC104, SC105, and SC106 (manufactured by Asahi Glass Co., Ltd.); and Organosiloxane polymer KP341 (manufactured by Shin-Etsu Chemical Co., Ltd.).

The blending amount of the surfactant is ordinarily 0.2% by mass or less, preferably 0.1% by mass or less, based on the total mass of the composition for forming a gate insulating film for a thin-film transistor of the present invention. These surfactants may be blended in the composition individually or in combination of two or more types thereof.

<Coupling Agent>

The composition for forming a gate insulating film for a thin-film transistor of the present invention may further contain a coupling agent for the purpose of enhancing the adhesion between the composition and the substrate so long as the effect of the present invention is not impaired. Examples of the coupling agent include functional silane-containing compounds and epoxy group-containing compounds.

Specific examples thereof include: functional silane-containing compounds such as 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-trimethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane; and epoxy group-containing compounds such as ethyleneglycol diglycidyl ether, polyethyleneglycol diglycidyl ether, propyleneglycol diglycidyl ether, tripropyleneglycol diglycidyl ether, polypropyleneglycol diglycidyl ether, neopentylglycol diglycidyl ether, 1,6-hexanediol diglycidyl ether, glycerin diglycidyl ether, 2,2-dibromoneopentylglycol diglycidyl ether, 6-tetraglycidyl-2,4-hexanediol, N,N,N',N'-tetraglycidyl-m-xylenediamine, 1,3-bis(N,N-diglycidylaminomethyl)cyclohexane, and N,N,N',N'-tetraglycidyl-4,4'-diaminodiphenylmethane.

When the above coupling agent is used, the coupling agent is added in a content of preferably 0.1 to 30 parts by mass, more preferably 1 to 20 parts by mass, relative to 100 parts by mass of the composition for forming a gate insulating film for a thin-film transistor of the present invention.

Here, in the present invention, it is possible to lower the crosslinking temperature and shorten the crosslinking time in the absence of a crosslinking catalyst, and the thus crosslinked film has characteristics satisfactory for a gate insulating film for an organic transistor.

<Production Methods of Coating Film and Cured Film (Gate Insulating Film)>

By applying the composition for forming a gate insulating film for a thin-film transistor of the present invention on a general-purpose plastic substrate such as polypropylene, polyethylene, polycarbonate, polyethylene terephthalate, polyether sulfone, polyethylene naphthalate, and polyimide, a glass substrate, or the like by a dipping method, a spin coating method, a transfer printing method, a roll coating method, an inkjet method, a spraying method, a brush-applying method, or the like and then by pre-drying the composition on a hot plate, in an oven, or the like, a coating film can be formed.

Then, by subjecting this coating film to heating treatment (baking), a cured film capable of being used as a gate insulating film is formed.

Although the method for the above heating treatment is not particularly limited, examples thereof include a method of performing the heating treatment using a hot plate or an oven in an appropriate atmosphere, that is, in air, an inert gas such as nitrogen, vacuum, or the like.

The baking temperature is preferably 40° C. or more, more preferably 150° C. or more, from the viewpoint of reducing a remaining solvent in the coating film. Taking into consideration the heat resistance of a plastic substrate, baking is performed more desirably at 180° C. or less.

Baking may be performed by varying the baking temperature in two or more steps. By performing baking stepwise, the uniformity of the cured film can further be enhanced.

The thus obtained gate insulating film of the present invention has a film thickness of preferably 5 to 5,000 nm, more preferably 50 to 1,000 nm, most preferably 200 to 600 nm. When the gate insulating film is too thin, the film causes a dielectric breakdown in a low electric field and thus, a transistor containing such a gate insulating film cannot function as the transistor. On the other hand, when the gate insulating film is too thick, a high voltage becomes necessary for functioning as a transistor, and therefore, the gate insulating film is desirably formed in the above range of film thickness.

Here, when by one process of application and heating treatment, a cured film (gate insulating film) having a desired thickness cannot be obtained, the process of application and heating treatment may be repeated until the gate insulating film obtains a desired film thickness.

<Thin-Film Transistor>

The constitution of the thin-film transistor of the present invention is not particularly limited so long as the thin-film transistor uses the gate insulating film of the present invention. As one example of the thin-film transistor, constitution examples of the thin-film transistor using the gate insulating film of the present invention are shown in FIG. 1 to FIG. 4.

Figure 2:
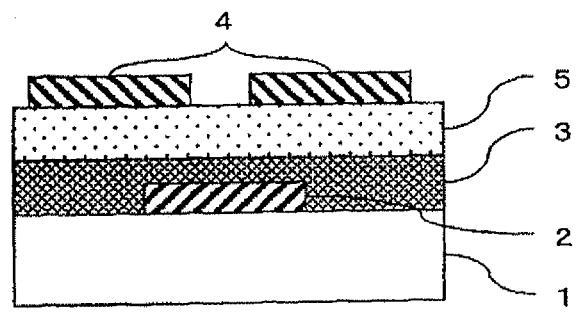
FIG. 2 is a schematic cross-sectional view showing a structure of a thin-film transistor of a second example having the gate insulating film of the present invention.
Figure 3:
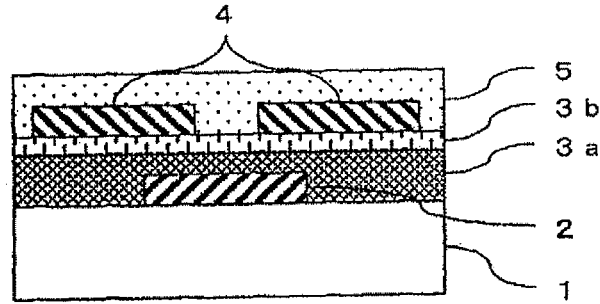
FIG. 3 is a schematic cross-sectional view showing a structure of a thin-film transistor of a third example having the gate insulating film of the present invention.

In examples of FIG. 1 to FIG. 3, in the thin-film transistor of the present invention, a gate electrode 2 is formed on a substrate 1 and the gate electrode 2 is covered with the gate insulating film 3 (or 3a, 3b) of the present invention.

In the example of FIG. 1, a source electrode 4 and a drain electrode 4 are mounted on the gate insulating film 3 and as covering these electrodes, a semiconductor layer 5 is formed.

On the other hand, in the example of FIG. 2, the semiconductor layer 5 is formed on the gate insulating film 3 and the source electrode 4 and the drain electrode 4 are mounted on the semiconductor layer 5.

In the example of FIG. 3, a gate insulating film 3b is formed on a gate insulating film 3a and the source electrode 4 and the drain electrode 4 are mounted on the gate insulating film 3b. The semiconductor layer 5 is formed as covering these electrodes 4. Here, the gate insulating film 3b has, besides a function as an insulating film for controlling the characteristics of the transistor, a function as a surface treating film or an electrode forming underlayer film for the source electrode 4 and the drain electrode 4.

Figure 4:
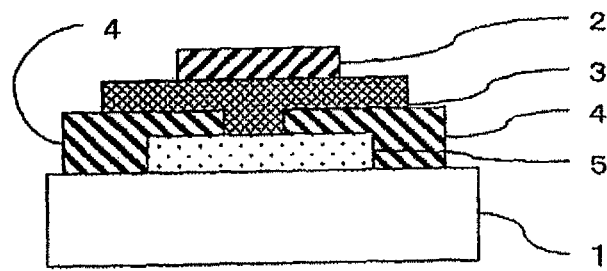
FIG. 4 is a schematic cross-sectional view showing a structure of a thin-film transistor of a fourth example having the gate insulating film of the present invention.

Further, in the example of FIG. 4, the semiconductor layer 5 is formed on the substrate 1 and the source electrode 4 and the drain electrode 4 are provided as covering both the semiconductor layer 5 and the substrate 1. Then, the gate insulating film 3 is formed over the semiconductor layer 5 and the source electrode 4 and the drain electrode 4, and over the gate insulating film 3, the gate electrode 2 is provided.

Examples of the electrode material (gate electrode, source electrode, drain electrode) used for the thin-film transistor of the present invention include: metals such as gold, silver, copper, aluminum, and calcium; inorganic materials such as carbon black, fullerenes, and carbon nanotubes; and organic π conjugate polymers such as polythiophene, polyaniline, polypyrrole, polyfluorene, and derivatives thereof.

Although these electrode materials may be used individually, for the purpose of the electric field-effect mobility enhancement and the on/off ratio enhancement of the thin-film transistor or for the purpose of the control of the threshold voltage, the electrode materials may be used in combination of a plurality thereof. Different electrode materials may be used for each of the gate electrode, the source electrode, and the drain electrode.

As a forming method of the electrode, generally used are a vacuum deposition method and a sputtering method. However, for simplifying the production method, there can also be used a forming method of the electrode by an applying method such as a spray coating method, a printing method, and an inkjet method. In recent years, there has been developed an applying method by partially changing the surface energy of the gate insulating film by irradiation with an ultraviolet ray to form a highly fine electrode pattern and this method is also applicable. Examples of the applicable electrode material include nano metal fine particles and organic π conjugate polymers.

In the electrode formation by an applying method, the solvent for a nano metal ink or an organic π conjugate polymer is preferably water or various alcohols because a damage (intermixing) against the gate insulating film of the present invention is small.

Although as the solvent, there is also preferred a polar solvent such as N,N-dimethylformamide, N,N-dimethylacetamide, 2-pyrrolidone, N-methyl-2-pyrrolidone, n-ethyl-2-pyrrolidone, n-vinyl-2-pyrrolidone, N-methylcaprolactam, dimethylsulfoxide, and tetramethylurea from the viewpoint of being excellent in dissolving the electrode material, these solvents are preferably used within a range in which a damage against the gate insulating film of the present invention is small.

Although the material used for the semiconductor layer contained in the thin-film transistor of the present invention is not particularly limited so long as the semiconductor layer can be formed on the gate insulating film of the present invention, the above electrode, and the above plastic substrate, specific examples thereof include: organic low molecular materials such as pentacene, oligothiophene derivatives, phthalocyanine derivatives; π conjugate polymers such as polythiophene derivatives, polyphenylenevinylene derivatives, and polyfluorene derivatives; and oxide semiconductors such as InGaZnO-based, InGaO-based, ZnGaO-based, InZnO-based, ZnO, and $SnO_2$.

As the film-making method of these semiconductor materials, there can be used a sputtering method, a vacuum deposition method, an inkjet method, and a spraying method. Particularly, applying methods such as the inkjet method and the spraying method are simple and can reduce the production cost, which is preferred.

Examples of the semiconductor material suitable for the applying method include π conjugate polymers having high solvent solubility and capable of easily obtaining a homogeneous thin-film.

During film formation, the solvent for the π conjugate polymer is not particularly limited so long as the solvent can dissolve or homogeneously disperse the π conjugate polymer and a damage (intermixing) against the gate insulating film of the present invention is caused in a small amount. Examples thereof include xylene, trichlorobenzene, and trimethylbenzene.

EXAMPLES

Hereinafter, the present invention will be further described in more detail referring to Examples that should not be construed as limiting the scope of the present invention.

[Measurement of Number Average Molecular Weight and Weight Average Molecular Weight]

In the present Examples, the molecular weight of P-1 obtained by polymerization was measured by a GPC (normal temperature gel permeation chromatography) apparatus, and the number average molecular weight and the weight average molecular weight were calculated as a value in terms of polystyrene.

GPC apparatus: manufactured by JASCO, Inc. (JASCO-BORWIN Ver. 1.50)

Column: manufactured by Shodex (804, 805 (in series))

Column temperature: 40° C.

Eluant: tetrahydrofuran

Flow rate: 1.0 ml/min

Standard sample for preparation of calibration curve: standard polystyrene (210,000, 70,600, 28,600, 10,900, 3,000, 1,300)

In the present Examples, the molecular weight of P-2 obtained by polymerization was measured by a GPC (normal temperature gel permeation chromatography) apparatus, and the number average molecular weight and the weight average molecular weight were calculated as a value in terms of polyethylene glycol or polyethylene oxide.

GPC apparatus: manufactured by Shodex (GPC-101)

Column: manufactured by Shodex (KD 803, KD 805 (in series))

Column temperature: 50° C.

Eluant: N,N-dimethylformamide (additives: lithium bromide monohydrate ($LiBr.H_2O$) in 30 mmol/L; phosphoric acid anhydride crystal (O-phosphoric acid) in 30 mmol/L; and tetrahydrofuran (THF) in 10 ml/L)

Flow rate: 1.0 ml/min

Standard sample for preparation of calibration curve: standard polyethylene oxide (molecular weight about 900,000, 150,000, 100,000, 30,000), and polyethylene glycol (manufactured by Polymer Laboratories Ltd.; molecular weight about 12,000, 4,000, 1,000)

[Measurement of Film Thickness]

The film thickness was determined by peeling a portion of the film with a cutter knife and measuring the step height using a full-automatic fine shape measuring machine (ET

[Synthesis of polymer compound used for composition for forming gate insulating film for thin-film transistor]

Synthesis Example 1

P-1

90 g of monoallyldiglycidylisocyanuric acid, 54.4 g of monoallylisocyanuric acid, and 3.66 g of benzyltriethylammonium chloride were charged into 222 g of cyclohexanone and the resulting mixture was warmed to 125° C. and was stirred for 4 hours while simultaneously flowing nitrogen into the mixture. Then, the resulting reaction solution was dropped into a methanol solvent and the resulting precipitation was filtered to obtain a reaction product P-1 (white powder).

The obtained reaction product P-1 was GPC-analyzed and was found to have a weight average molecular weight (Mw) of 21,500 in terms of standard polystyrene.

Here, the reaction product P-1 has a structure unit of Formula (13):

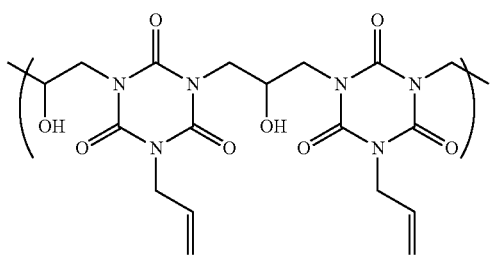

(13)

Comparative Synthesis Example 1

P-2

4.86 g of p-phenylenediamine and 1.74 g of 4-hexadecyloxy-1,3-diaminobenzene were dissolved in 122.5 g of n-methylpyrrolidone (hereinafter, called NMP), and to the resulting solution, 15.01 g of 3,4-dicarboxy-1,2,3,4-tetrahydro-1-naphthalenesuccinic dianhydride was added, followed by stirring the resulting reaction mixture at room temperature for 10 hours to effect the polymerization reaction. The resulting solution of polyamide acid was diluted with NMP to 8% by weight. To 50 g of the resulting solution, 10.8 g of acetic anhydride as an imidation catalyst and 5.0 g of pyridine were added and the reaction was effected at 50° C. for 3 hours to obtain a polyimide solution. The solution was charged into a large amount of methanol and the resulting white precipitation was filtered and was dried to obtain a white polyimide powder. The polyimide powder was confirmed by $^1$H-NMR to be imidated by 90%.

Here, the obtained polyimide was found to have a number average molecular weight (Mn) of 18,000 and a weight average molecular weight (Mw) of 54,000.

Example 1

Preparation of Composition A 20 g of P-1 (white powder) obtained in Synthesis Example 1 was dissolved in a solvent mixture of 107 g of γ-butyrolactone (hereinafter, called GBL), 47 g of cyclohexanone, and 19 g of propylene glycol monomethyl ether (hereinafter, called PGME), and to the resulting reaction solution, 8 g of blocked isocyanate of Formula (10) and 0.84 g of a surfactant R-30 were added to obtain a composition A having a solid content of 14% by weight.

Comparative Example 1

Preparation of Composition B 10 g of P-1 (white powder) obtained in Synthesis Example 1 was dissolved in a solvent mixture of 75 g of GBL and 15 g of dipropylene glycol monobutyl ether (hereinafter, called DPM) to obtain a composition B.

Comparative Example 2

Preparation of Composition C 10 g of P-2 (white powder) obtained in Comparative Synthesis Example 1 was dissolved in a solvent mixture of 75 g of GBL and 15 g of DPM to obtain a composition C.

Solvent Resistance

Example 2

Solvent Resistance of Film Using Composition A

To a glass substrate (2.5 cm square, 0.7 mm thickness) with ITO, the composition A prepared in Example 1 was dropped from a syringe with a filter having a pore diameter of 0.2 μm and the composition was applied thereon by a spin coating method. Then, in the atmosphere, the resulting coating film was subjected to heating treatment on a hot plate of 80° C. for 5 minutes to volatilize the organic solvent. Next, the coating film was baked on a hot plate of 180° C. for 30 minutes to obtain a gate insulating film having a film thickness of about 400 nm.

Next, the glass substrate with the film was immersed in each solvent of propylene glycol monomethyl ether acetate (hereinafter, called PGMEA), PGME, and acetone for 1 minute, and then, the glass substrate with the film was dried by heating the substrate on a hot plate of 150° C. for 1 minute. The film thicknesses before and after the immersion (film remaining rate) were measured and the solvent resistance of the film was evaluated. As the result, it was found that the film composed of the composition A had a film remaining rate of 99% or more relative to every solvent and exhibits excellent solvent resistance.

Comparative Example 3

Solvent Resistance of Film Using Composition B

In the same procedure as in Example 2, a gate insulating film composed of the composition B was obtained. Then, in the same procedure as in Example 2, the solvent resistance of the gate insulating film was evaluated. The film composed of the composition B was dissolved in all solvents of PGMEA, PGME, and acetone. That is, it was exhibited that the gate insulating film composed of the composition B cannot endure the production process of an organic transistor.

[Production of insulating film, and electrical characteristics evaluation and light resistance of the insulating film]

Example 3

Characteristics of Insulating Film Using Composition A

To a glass substrate (2.5 cm square, 0.7 mm thickness) with ITO, the composition A prepared in Example 1 was dropped from a syringe with a filter having a pore diameter of 0.2 μm and the composition was applied thereon by a spin coating method. Then, in the atmosphere, the resulting coating film was subjected to heating treatment on a hot plate of 80° C. for 5 minutes to volatilize the organic solvent. Next, the coating film was baked on a hot plate of 180° C. for 30 minutes to obtain a gate insulating film having a film thickness of about 400 nm.

Next, using a vacuum deposition apparatus, an aluminum electrode having a diameter of 1.0 to 2.0 mm and a film thickness of 100 nm was laminated on the above insulating film to produce a sample for evaluation of insulation properties in which the electrode was set at the upper limit of the insulating film. Here, at this time, the vacuum deposition conditions were at room temperature, under a vacuum degree of $1 \times 10^{-3}$ Pa or less, and at a deposition rate of aluminum of 0.4 nm/sec or less.

The sample was left to stand still in the atmosphere for 1 hour, and then in the atmosphere, the current-voltage characteristic was measured. The voltage was applied on the aluminum electrode side in such a manner that the voltage was increased from 0 V to 60 V with a retention time of 3 seconds every 2 V step, and the specific resistance was measured from a current value when the electric field was 1 MV/cm. It was found that the insulating film composed of the composition A had a specific resistance of $1 \times 10^{16}$ Ωcm, which is a specific resistance not less than $10^{15}$ Ωcm required for the insulating film for an electronic device, so that the insulating film exhibits excellent characteristics. Here, the gate insulating film was found to have a dielectric constant of 3.5.

Example 4

Light Resistance of Insulating Film Using Composition A

Using the same procedure as that in Example 3, a gate insulating film composed of the composition A was obtained. Next, the gate insulating film was irradiated with an ultraviolet ray from a light source of a high pressure mercury lamp at 10 J/cm² through a band pass filter transmitting a light having a wavelength of around 254 nm.

Here, for calculating the exposing amount on the gate insulating film, the illuminance of an ultraviolet ray was measured using an illuminometer (manufactured by OAI, MODEL 306) in which a probe for Deep UV having a peak sensitivity at 253.7 nm was fitted and the measured illuminance was 45 to 50 mW/cm².

Next, on a substrate having an insulating film irradiated with an ultraviolet ray at 10 J/cm², an aluminum electrode was laminated using the same procedure as that in Example 3 to prepare a sample for evaluating light resistance.

The sample was left to stand still in the atmosphere for 1 hour, and then in the atmosphere, the current-voltage characteristic was measured. The voltage was applied on the aluminum electrode side in such a manner that the voltage was increased from 0 V to 60 V with a retention time of 3 seconds every 2 V step, and the specific resistance was measured from a current value when the electric field was 1 MV/cm. It was found that the specific resistance of an insulating film irradiated with an ultraviolet ray at 10 J/cm² was $7 \times 10^{15}$ Ωcm and the insulating film composed of the composition A caused a small amount of change in the resistance amount between before and after the ultraviolet ray irradiation and has high light resistance.

Comparative Example 4

Characteristics of Insulating Film Using Composition C

Using the same procedure as that in Example 3, the insulation properties of a gate insulating film composed of the composition C were evaluated. The result thereof is shown in Table 1. It was found that the specific resistance of the insulating film composed of the composition C was $8 \times 10^{15}$ Ωcm and the dielectric constant of the gate insulating film was 3.3.

Comparative Example 5

Light Resistance of Insulating Film Using Composition C

Using the same procedure as that in Example 4, the light resistance of a gate insulating film composed of the composition C was evaluated. The result thereof is shown in Table 1. The resistance value of the insulating film composed of the composition C lowered to $1 \times 10^{15}$ Ωcm due to irradiation with an ultraviolet ray, so that there was exhibited the result that the insulating film has low light resistance.

TABLE 1

| | Change in volume resistivity between before and after ultraviolet ray irradiation | |
|---|---|---|
| | Unirradiated with UV | After irradiation at 10 J/cm |
| Example 3, 4  Composition A | $1 \times 10^{16}$ Ωcm | $7 \times 10^{15}$ Ωcm |
| Comparative  Composition C | $8 \times 10^{15}$ Ωcm | $1 \times 10^{15}$ Ωcm |
| Example 4, 5 | | |

[Production of organic transistor and electrical characteristics of the transistor]

Example 5

To a glass substrate (2.5 cm square, 0.7 mm thickness) with ITO, the composition A prepared in Example 1 was dropped from a syringe with a filter having a pore diameter of 0.2 μm and the composition was subjected to heating treatment (pre-drying) for 5 minutes to volatilize the organic solvent. Next, the resulting coating film was baked on a hot plate of 180° C. for 30 minutes to obtain a gate insulating film having a film thickness of about 400 nm.

The capacitance C of the gate insulating film was found to be $7.7 \times 10^{-9}$ (F/cm²).

Next, on the gate insulating film, a semiconductor layer was formed.

First, poly(3-hexyl)thiophene (hereinafter, called P3HT) was dissolved in m-xylene in a concentration of 2% by mass to prepare a coating solution of P3HT, and in a nitrogen atmosphere, the coating solution was applied on the above gate insulating film by a spin coating method. Then, in order to completely volatilize the solvent, the resulting coating film was subjected to heating treatment at 105° C. in a vacuum state for 60 minutes to prepare a semiconductor layer.

Further, on the semiconductor layer (P3HT film), gold was laminated in a thickness of about 80 nm using a vacuum deposition apparatus to form a source/drain electrode having a channel length L of 90 μm and a channel width W of 2 mm to complete an organic transistor. Here, the cross sectional view of an organic thin-film transistor shown in FIG. 2 corresponds to the organic transistor of Example 5.

At this time, the conditions during the vacuum deposition of the electrode were at room temperature, at a vacuum degree of $1 \times 10^{-3}$ Pa or less, and at a deposition rate of gold of 0.1 nm/sec or less.

As described above, the characteristics of the drain current and the gate voltage of the electrical characteristics of the obtained organic transistor in vacuum were evaluated.

In detail, the source/drain voltage (VD) was set at −40 V and a value of the current after retaining the voltage for 1 second until the current was satisfactorily stabilized while changing the gate voltage (VG) from +30 V to −40 V with a 2 V step, was recorded as a measured value of the drain current. Here, for the measurement, a semiconductor parameter analyzer (HP4156C; manufactured by Agilent Technologies, Inc.) was used.

Figure 5:
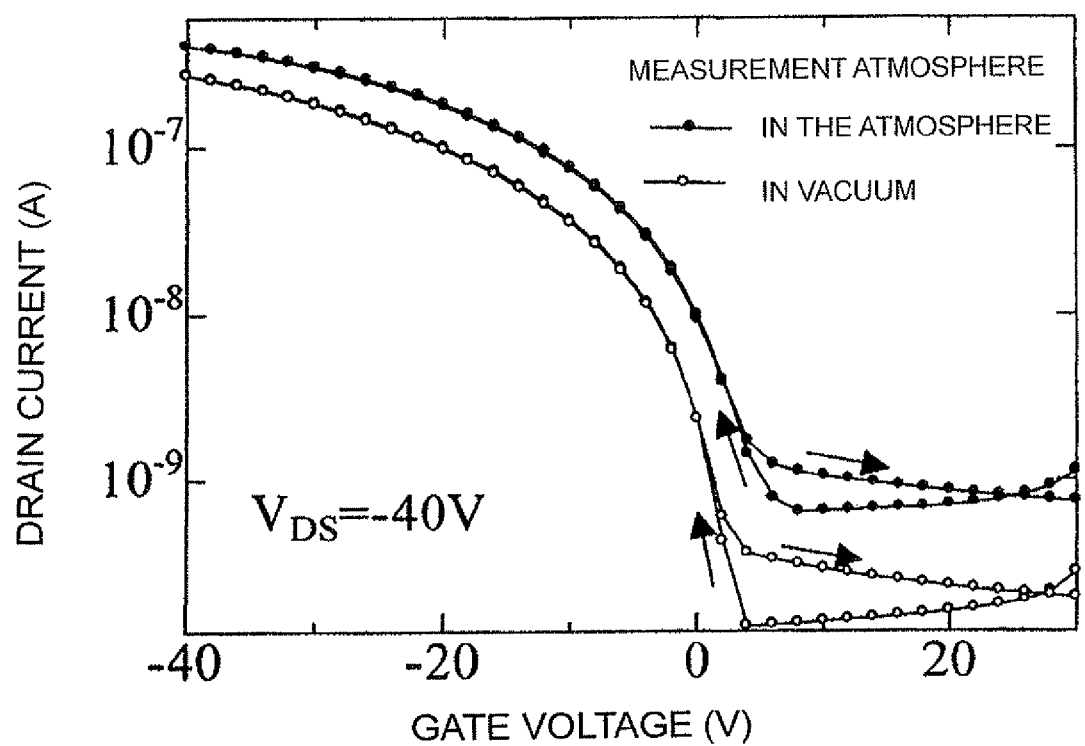
FIG. 5 is a graph showing a relationship between a drain current and gate voltage of an organic thin-film transistor having a gate insulating film obtained from a composition A in Example 5.

As the thus measured characteristics ($V_G$–$I_D$ characteristics) of the drain current relative to the gate voltage, when the gate voltage was decreased to minus, a large increase of the drain current was obtained, so that P3HT operated as a p-type semiconductor. The result is shown in FIG. 5.

Generally, the drain current $I_D$ in a saturated state can be expressed by the equation below. That is, the mobility μ of an organic semiconductor can be obtained from the slope of a graph made by plotting a square root of an absolute value of the drain current $I_D$ on the ordinate axis and plotting the gate voltage $V_G$ on the abscissa axis.

$$I_D = WC\mu(V_G - V_T)^2 / 2L$$

In the above equation: W is a channel width of the transistor; L is a channel length of the transistor; C is a capacitance of the gate insulating film; $V_T$ is a threshold voltage of the transistor; and μ is a mobility. The mobility μ of P3HT was calculated based on this equation and was found to be $2 \times 10^{-3}$ cm$^2$/Vs. The threshold voltage was found to be +3V and the ratio (on/off ratio) of an on state and an off state was found to be in the order of $10^3$. Here, the hysteresis was not observed. Until here, all of the evaluations of the organic transistor were performed in vacuum.

Next, the organic transistor was exposed to the atmosphere for 1 minute, and in the same manner as described above, the characteristics of the drain current and the gate voltage were evaluated. The result thereof is shown in FIG. 5. Although the drain current value shifted to a high current side, the on/off ratio and the hysteresis did not change and advantageous characteristics thereof were obtained.

In other words, it was exhibited that the gate insulating film obtained from the composition A is applicable as a gate insulating film for an organic transistor.

The above result is summarized in Table 2.

TABLE 2

|  |  |  |  | Evaluation of gate insulating film | | | |
|---|---|---|---|---|---|---|---|
|  |  | Component | | Solvent resistance | Insulation properties | Light resistance | FET characteristic |
|  |  | (i) | (ii) |  |  |  |  |
| Example | Composition A | P-1 | Existing | ○ (Example 2) | ○ (Example 3) | ○ (Example 4) | ○ (Example 5) |
| Comparative Example | Composition B | P-1 | None | X (Comparative Example 3) | — | — | — |
|  | Composition C | P-2 | None | — | ○ (Comparative Example 4) | X (Comparative Example 5) | — |

From the above result, the composition for forming a gate insulating film for a thin-film transistor of the present invention possess the solvent resistance, insulation properties, and light resistance that are required for formation of a gate insulating film, and further are excellent in the FET characteristics.

Description of the Reference Numerals
1: Substrate
2: Gate electrode
3 (3a, 3b): Gate insulating film
4: Source electrode, drain electrode
5: Semiconductor layer

The invention claimed is:
1. A thin-film transistor comprising:
a substrate;
a gate electrode;
a gate insulating film comprising:
  a component (i): an oligomer compound or a polymer compound with a repeating unit represented by the following formula (1):

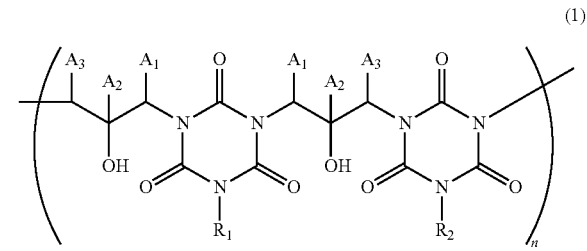

where:
  $R_1$ and $R_2$ are independently a $C_{1-6}$ alkyl group, a $C_{3-6}$ alkenyl group, a monovalent organic group containing a $C_{6-10}$ aromatic ring, a trifluoromethyl group, or a pentafluoroethyl group;
  $A_1$, $A_2$, and $A_3$ are independently a hydrogen atom, a methyl group, or an ethyl group; and
  n is an integer of 2 to 500; and
a component (ii): a compound having two or more blocked isocyanate groups in one molecule thereof;
a source electrode and a drain electrode; and
a semiconductor layer.

2. The thin-film transistor according to claim 1, wherein the component (ii) is at least one compound among compounds of Formula (2) to Formula (4):

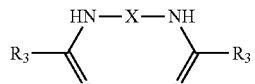
(2)

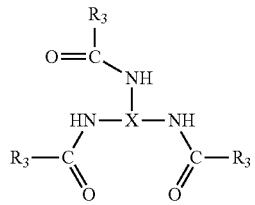
(3)

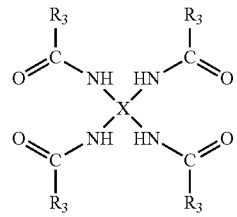
(4)

where X is a divalent to tetravalent organic group; and $R_3$ is a monovalent organic group of a blocking portion.

3. The thin-film transistor according to claim 1, wherein the component (ii) is at least one compound among compounds of Formula (5) to Formula (7):

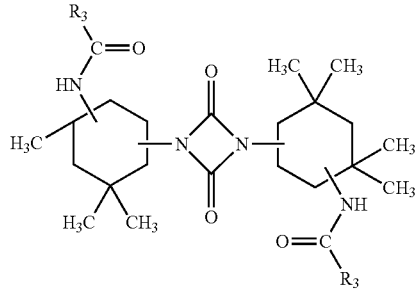
(5)

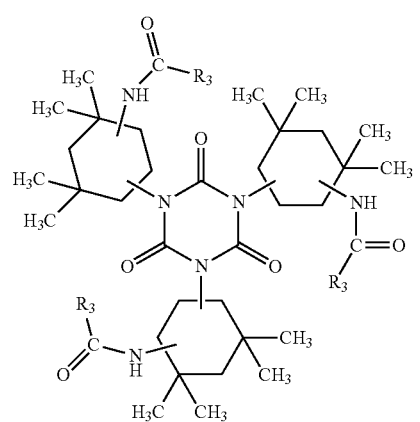
(6)

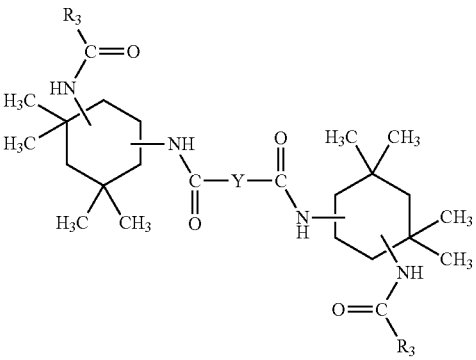
(7)

where Y is a $C_{1-10}$ alkylene group; and $R_3$ is a monovalent organic group of a blocking portion.

4. The thin-film transistor according to claim 1, wherein the component (ii) is a compound of Formula (10):

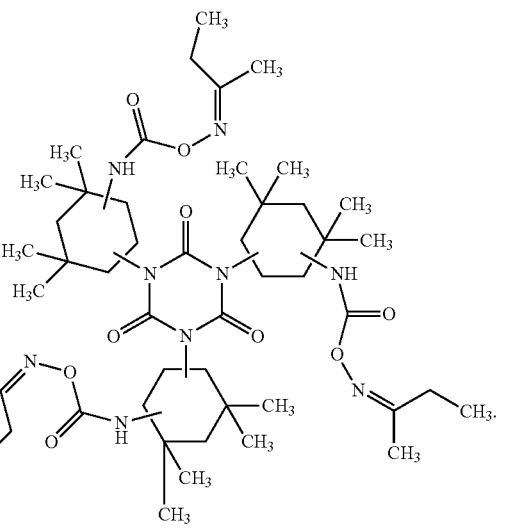
(10)

5. The thin-film transistor according to claim 1, wherein the component (i) is a reaction product of a compound of Formula (8) and a compound of Formula (9):

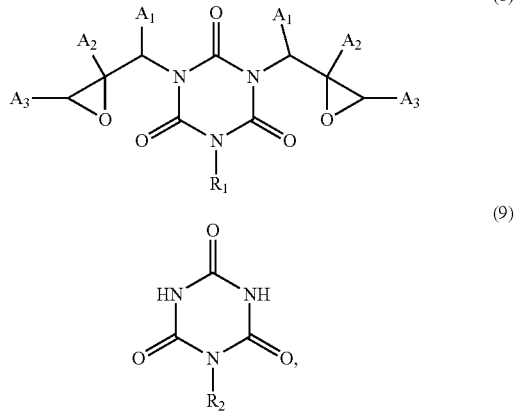
(8)
(9)

where $R_1$, $R_2$, $A_1$, $A_2$, and $A_3$ are individually the same as those defined in Formula (1).

6. The thin-film transistor according to claim 1, wherein the component (ii) is contained at 10 to 100 parts by mass relative to 100 parts by mass of the component (i).

7. A production method of a gate insulating film for a thin-film transistor, the production method comprising:
applying onto a substrate a composition comprising:
a component (i): an oligomer compound or a polymer compound with a repeating unit represented by the following formula (1):

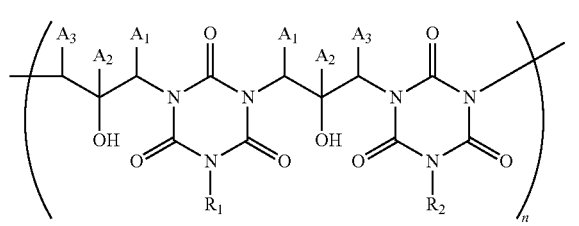

where:
$R_1$ and $R_2$ are independently a $C_{1-6}$ alkyl group, a $C_{3-6}$ alkenyl group, a monovalent organic group containing a $C_{6-10}$ aromatic ring, a trifluoromethyl group, or a pentafluoroethyl group;
$A_1$, $A_2$ and $A_3$ are independently a hydrogen atom, a methyl group, or an ethyl group; and
n is an integer of 2 to 500; and
a component (ii): a compound having two or more blocked isocyanate groups in one molecule thereof; and
baking the composition at a temperature of 180° C. or less.

8. A production method of a thin-film transistor, the production method comprising:
applying onto a substrate a composition comprising:
a component (i): an oligomer compound or a polymer compound with a repeating unit represented by the following formula (1):

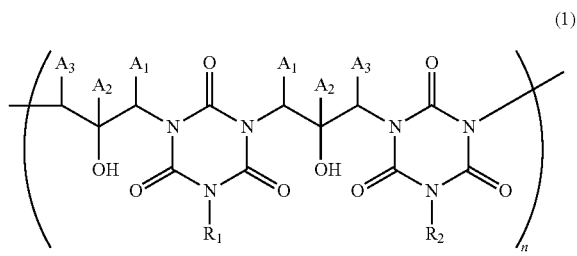

where:
$R_1$ and $R_2$ are independently a $C_{1-6}$ alkyl group, a $C_{3-6}$ alkenyl group, a monovalent organic group containing a $C_{6-10}$ aromatic ring, a trifluoromethyl group, or a pentafluoroethyl group;
$A_1$, $A_2$ and $A_3$ are independently a hydrogen atom, a methyl group, or an ethyl group; and
n is an integer of 2 to 500; and
a component (ii): a compound having two or more blocked isocyanate groups in one molecule thereof;
baking the composition at a temperature of 180° C. or less to obtain a gate insulating film for a thin-film transistor; and
forming a semiconductor layer of a thin-film transistor on the gate insulating film by applying an organic semiconductor.

* * * * *